United States Patent
Chiang et al.

(10) Patent No.: US 8,851,529 B2
(45) Date of Patent: Oct. 7, 2014

(54) ELECTRONIC DEVICE AND LATCHING MECHANISM THEREOF

(71) Applicant: Wistron Corp., New Taipei (TW)

(72) Inventors: Shu-Chen Chiang, New Taipei (TW); Tian-Shyang Lin, New Taipei (TW); Wen-Chin Wu, New Teipei (TW); Pin-Hsien Su, New Taipei (TW); Ming-Hua Hung, New Taipei (TW)

(73) Assignee: Wistron Corp., New Taipei (TW)

( * ) Notice: Subject to any disclaimer, the term of this patent is extended or adjusted under 35 U.S.C. 154(b) by 21 days.

(21) Appl. No.: 13/750,921

(22) Filed: Jan. 25, 2013

(65) Prior Publication Data

US 2013/0307389 A1 Nov. 21, 2013

(30) Foreign Application Priority Data

May 16, 2012 (TW) .............................. 101117313 A

(51) Int. Cl.
*E05C 9/00* (2006.01)

(52) U.S. Cl.
USPC ................ 292/44; 292/156; 292/32; 292/117

(58) Field of Classification Search
USPC ......... 292/44, 4, 5, 6, 11, 32, 45, 59, 68, 116, 292/117, 156, 157
See application file for complete search history.

(56) References Cited

U.S. PATENT DOCUMENTS

| 2,343,977 | A  | * | 3/1944 | Jones et al. | 292/5 |
| 7,585,005 | B1 | * | 9/2009 | Cote et al. | 292/38 |
| 2003/0006616 | A1 | * | 1/2003 | Katoh et al. | 292/32 |
| 2006/0170223 | A1 |   | 8/2006 | Homer et al. |  |

FOREIGN PATENT DOCUMENTS

TW 201124043 A 7/2011

OTHER PUBLICATIONS

Taiwan Patent Office, Office Action, Patent Application Serial No. 101117313, Apr. 2, 2014, Taiwan.

* cited by examiner

*Primary Examiner* — Mark Williams

(57) ABSTRACT

An electronic device is provided, including a main body, a latching mechanism, and a movable member. The latching mechanism is disposed on the main body to join with the movable member. The latching mechanism includes a rod, a first latching member disposed on a side of the rod, a second latching member connected to the rod, a first elastic member connecting the first latching member with the main body, a second elastic member connecting the second latching member with the main body, and a rotary member. The rotary member pivotally connects to the main body, and connects the rod with the first latching member.

8 Claims, 4 Drawing Sheets

ELECTRONIC DEVICE AND LATCHING MECHANISM THEREOF

CROSS REFERENCE TO RELATED APPLICATIONS

This Application claims priority of Taiwan Patent Application No. 101117313, filed on May 16, 2012, the entirety of which is incorporated by reference herein.

BACKGROUND OF THE INVENTION

1. Field of the Invention

The application relates in general to an electronic device and in particular to an electronic device having a latching mechanism.

2. Description of the Related Art

Conventional notebook computers usually comprise removable members such as keyboard, top cover, and cooling modules, wherein the removable members are joined with the main body of the notebook computers by screws or hook structures. However, the removable members may be shaken even when joined to the main body, and the process of fixing the removable members to the main body is usually complicated.

BRIEF SUMMARY OF INVENTION

An embodiment of the invention provides an electronic device and a latching mechanism thereof, wherein the latching mechanism is disposed on the main body of the electronic device to join with a removable member. The latching mechanism primarily comprises a rod, a first latching member, a second latching member, a first elastic member, a second elastic member, and a rotary member, wherein the first latching member is disposed on a side of the rod, and the second latching member is connected to the rod. The first elastic member connects the first latching member with the main body, and the second elastic member connects the second latching member with the main body. The rotary member, pivotally connected to the main body, connects the rod with the first latching member. The first and second latching members may close or separate from each other by applying a force to the removable member or the rod, so as to join with or release from the removable member.

DETAILED DESCRIPTION OF INVENTION

Figure 1:
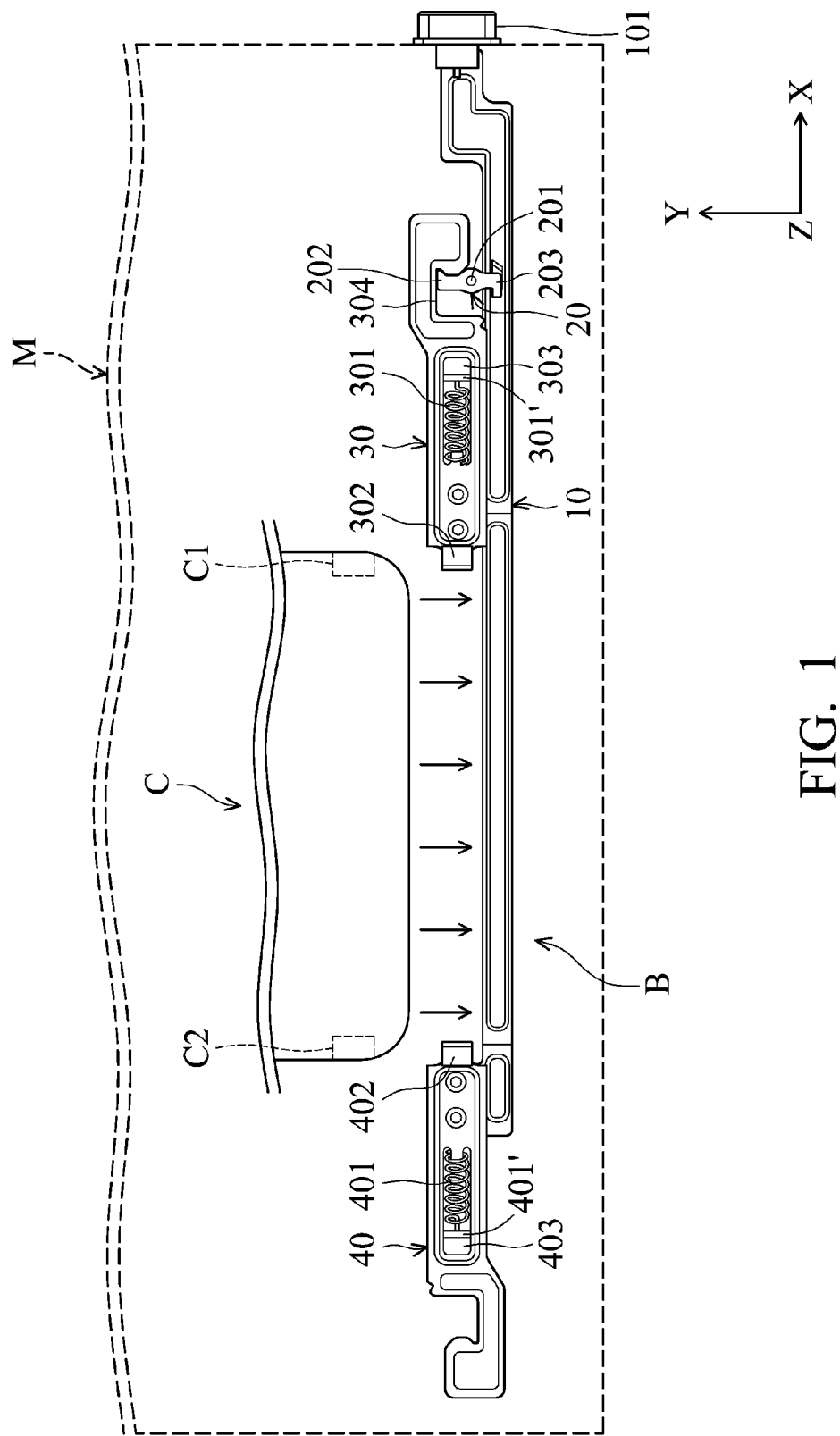
FIG. 1 is a perspective diagram of a latching mechanism disposed on the main body of an electronic device according to an embodiment of the invention.

Referring to FIG. 1, an embodiment of a latching mechanism B is disposed on the main body M of an electronic device. The electronic device, such as a notebook computer or a mobile communication device, comprises a movable part (not shown) which is slidable or rotatable relative to the main body M. The movable part may comprise the keyboard or cover module of the electronic device, and a removable member C is disposed on the movable part. When the latching mechanism B joins with the removable member C, the movable part of the electronic device is fixed to the main body M.

Figure 2:
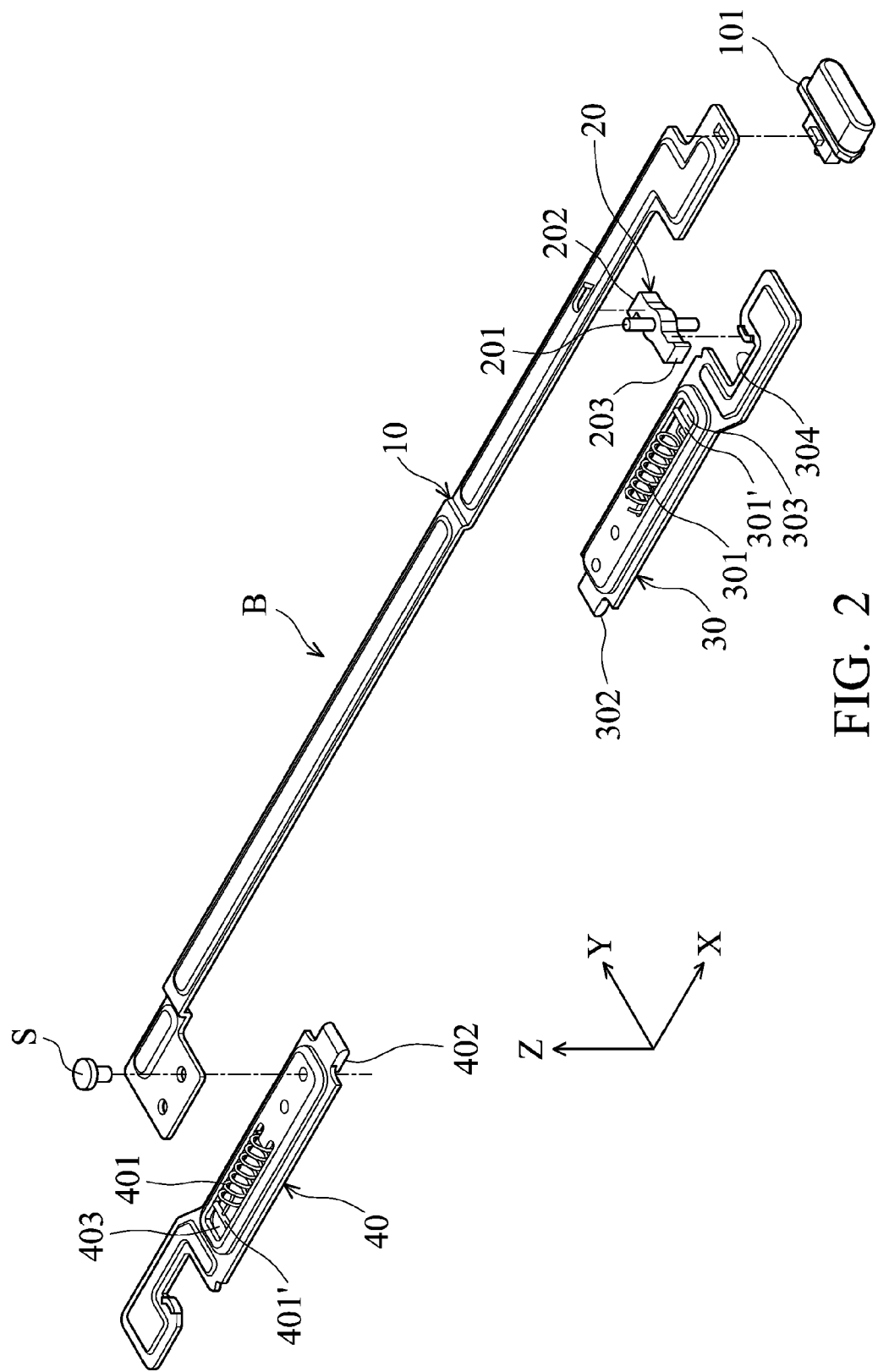
FIG. 2 is a perspective diagram of a latching mechanism according to an embodiment of the invention.

Referring to FIGS. 1 and 2, the latching mechanism B primarily comprises a rod 10, a rotary member 20, a first latching member 30, a second latching member 40, a button 101, a first elastic member 301, and a second elastic member 401. As shown in FIGS. 1 and 2, the rod 10 is an elongated member, the button 101 is disposed at an end of the rod 10 and exposed to a side of the main body M. The first latching member 30 is disposed on a side of the rod 10 and substantially parallel thereto. The rotary member 20 is disposed between the rod 10 and the first latching member 30, and pivotally connected to the main body M through a pivot 201. Two end portions 202 and 203 of the rotary member 20 are respectively connected to the rod 10 and the first latching member 30. Additionally, the second latching member 40 is fixed to the rod 10 by a connecting member S, and substantially parallel to the rod 10.

As shown in FIGS. 1 and 2, the first and second latching members 30 and 40 are located on the same axis and respectively form first and second latching portions 302 and 402 and first and second grooves 303 and 403. The first and second elastic members 301 and 401 are respectively received in the first and second grooves 303 and 403, wherein an end of the first and second elastic members 301 and 401 are respectively connected to the first and second latching members 30 and 40, and the other end thereof respectively form connecting portions 301' and 401' fixed to the main body M. The first and second elastic members 301 and 401 can slide in the grooves 303 and 403 respectively, so as to provide elastic force to join the first and second latching portions 302 and 402 with the removable member C.

Specifically, a slot 304 is formed on the first latching member 30, and an end 202 of the rotary member 20 is received in the slot 304. When the rod 10 moves along the −X direction and forces the rotary member 20 to rotate, the end 202 of the rotary member 20 pushes the first latching member 30 along the X direction.

Figure 3:
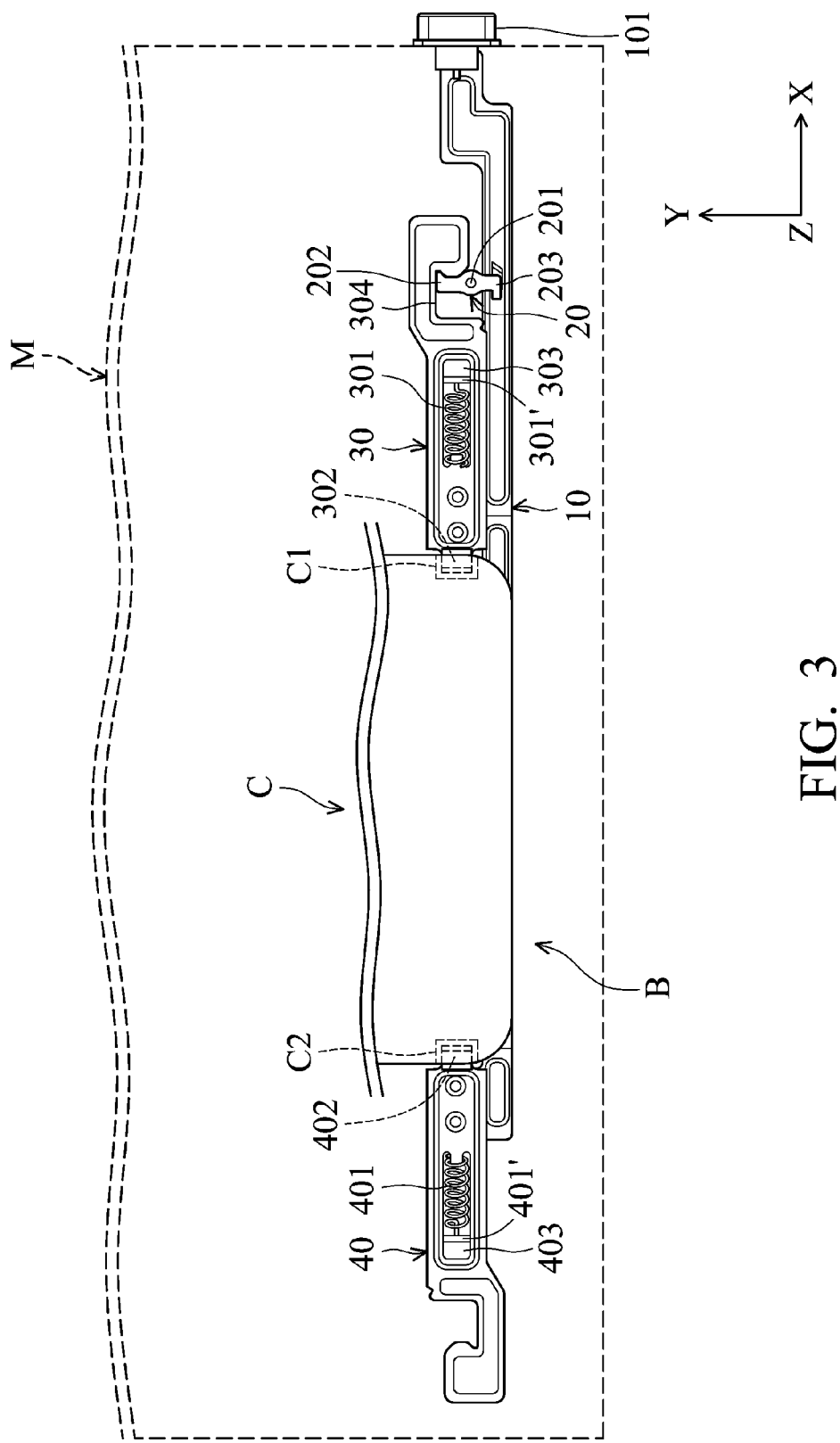
FIG. 3 is a perspective diagram of a latching mechanism joined with a removable member according to an embodiment of the invention.

Referring to FIGS. 1 and 3, two sides of the removable member C respectively form first and second recesses C1 and C2. When the removable member C moves toward the rod 10 to a joining position, the first and second latching portions 302 and 402 of the first and second latching members 30 and 40 engage with the first and second recesses C1, C2 respectively, so as to fix the removable member C to the main body M (FIG. 3).

As shown in FIG. 1, when the removable member C is separated from the main body M, the first and second latching members 30, 40 are located in a predetermined position. When the removable member C moves toward the rod 10 (−Y direction), the removable member 10 pushes the first and second latching members 30 and 40 to move along the X direction (the first direction) and the −X direction (the second direction) respectively and separate from each other, such that the first and second elastic member 301 and 401 are compressed in the grooves 303 and 403.

In FIG. 3, when the removable member C moves toward the rod 10 to the joining position, the first and second latching members 30 and 40 are forced by the first and second elastic members 301 and 401 along the −X direction (the second direction) and the X direction (the first direction) respectively and close to each other, thus returning to the predetermined position. Namely, the first and second latching portions 302 and 402 of the first and second latching members 30 and 40 can respectively join with the first and second recess C1 and C2, so as to fix the removable member C to the main body M.

Figure 4:
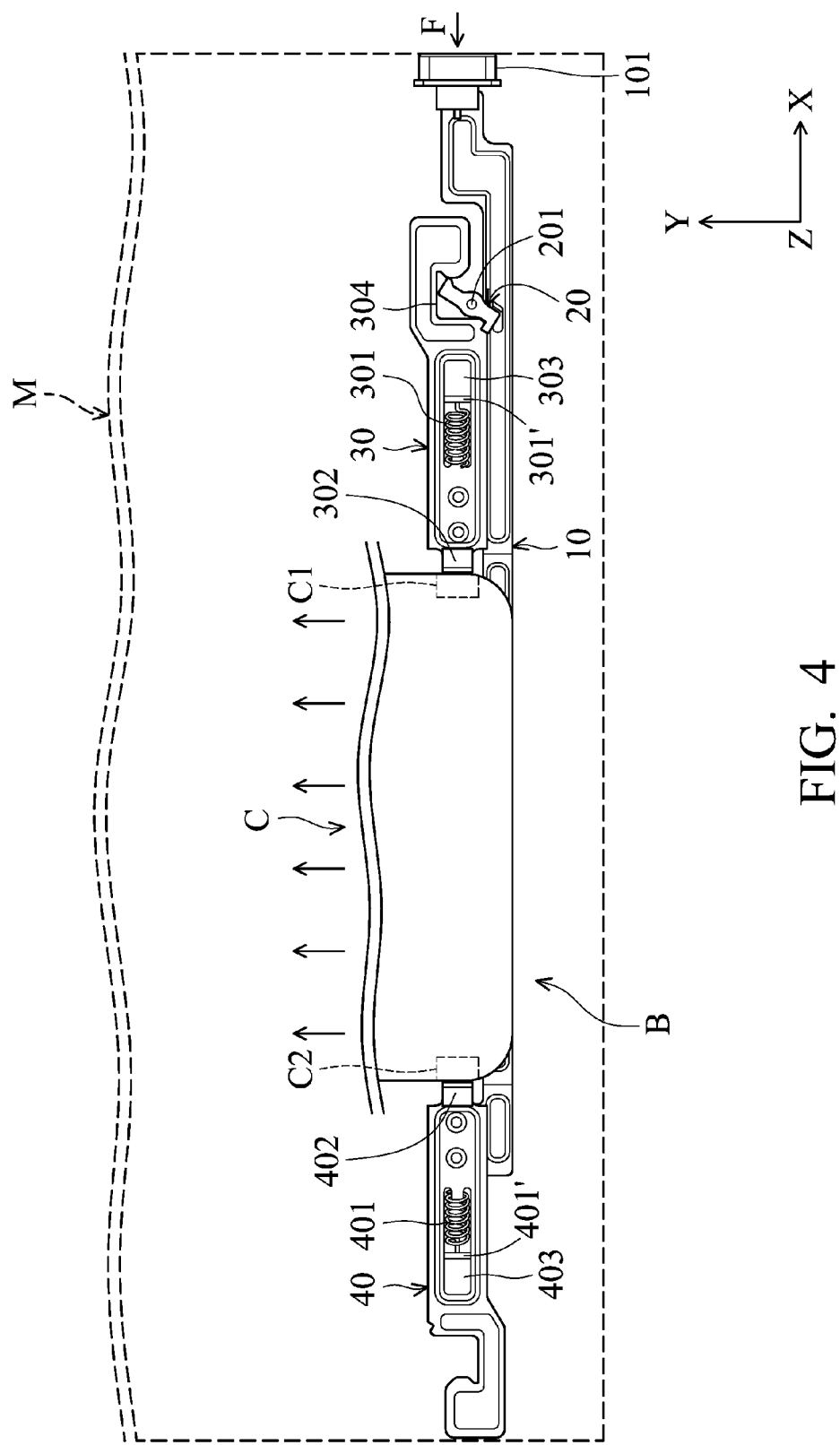
FIG. 4 is a perspective diagram of a latching mechanism releasing from the removable member according to an embodiment of the invention.

Referring to FIG. 4, to separate the removable member C from the main body M, an external force F may be applied to the button 101 on the side of the rod 10 along the −X direction. When the button 101 is pushed by an external force F, the rod 10 and the second latching member 40 move along the −X direction, and the rotary member 20 rotates clockwise to push the first latching member 30 along the X direction. Thus, the first and second latching portions 302 and 402 of the first and second latching members 30 and 40 are separated from the first and second recesses C1 and C2 of the removable member C, such that the removable member C can be released and separate from the main body M along the Y direction.

The invention provides an electronic device and a latching mechanism thereof, wherein the latching mechanism is disposed on the main body of the electronic device to join with a removable member. The latching mechanism primarily comprises a rod, a first latching member, a second latching member, a first elastic member, a second elastic member, and a rotary member, wherein the first latching member is disposed on a side of the rod, and the second latching member is connected to the rod. The first elastic member connects the first latching member with the main body, and the second elastic member connects the second latching member with the main body. The rotary member, pivotally connected to the main body, connects the rod with the first latching member. The first and second latching members may close or separate from each other by applying a force to the removable member or the rod, so as to join with or release from the removable member.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A latching mechanism, configured to be disposed on a main body of an electronic device to fix a removable member of the electronic device to the main body in a joining position, comprising:
   a rod;
   a first latching member, disposed on a side of the rod;
   a second latching member, connected to the rod;
   a first elastic member, fixed to the main body and connected to the first latching member;
   a second elastic member, fixed to the main body and connected to the second latching member; and
   a rotary member, pivotally connected to the main body and disposed between the rod and the first latching member;
   arranged such that when the removable member is moved towards the rod and contacts the first and second latching members, the first and second latching members are pushed by the removable member to move along a first direction and a second direction respectively, wherein the first direction is opposite to the second direction;
   when the removable member is moved further towards the rod into the joining position, the first and second latching members are forced by the first and second elastic members to move along the second and first directions, respectively, such that the first and second latching members join with the removable member; and
   when the removable member is in the joining position and the rod is pushed by an external force along the second direction, the rod drives the second latching member to move along the second direction, and the rod drives the rotary member to force the first latching member to move along the first direction, such that the first and second latching members are separated from each other and the removable member is released.

2. The latching mechanism as claimed in claim 1, wherein a slot is formed on the first latching member with an end of the rotary member received therein.

3. The latching mechanism as claimed in claim 1, wherein the latching mechanism further comprises a button connected to the rod and exposed to a side of the main body.

4. The latching mechanism as claimed in claim 1, wherein the first and second latching members are located on the same axis.

5. An electronic device, comprising:
   a main body;
   a latching mechanism configured to be disposed on the main body, comprising:
      a rod;
      a first latching member, disposed on a side of the rod;
      a second latching member, connected to the rod;
      a first elastic member, fixed to the main body and connected to the first latching member;
      a second elastic member, fixed to the main body and connected to the second latching member;
      a rotary member, pivotally connected to the main body and disposed between the rod and the first latching member; and
   a removable member, detachably connected to the main body and forming a first recess and a second recess;
   arranged such that when the removable member is moved towards the rod and contacts the first and second latching members, the first and second latching members are pushed by the removable member to move along a first direction and a second direction, respectively, wherein the second direction is opposite to the first direction;
   when the removable member is moved further towards the rod to a joining position, the first and second latching members are forced by the first and second elastic members to move along the second and first directions, respectively, such that the first and second latching members respectively join with the first and second recesses; and
   when the removable member is in the joining position and the rod is pushed by an external force along the second direction, the rod drives the second latching member to move along the second direction, and the rod drives the rotary member to force the first latching member to move along the first direction, such that the first and second latching members are separated from each other and the removable member is released.

6. The electronic device as claimed in claim 5, wherein a slot is formed on the first latching member with an end of the rotary member received therein.

7. The electronic device as claimed in claim 5, wherein the latching mechanism further comprises a button connected to the rod and exposed to a side of the main body.

8. The electronic device as claimed in claim 5, wherein the first and second latching members are located on the same axis.

* * * * *